United States Patent
Kang et al.

(10) Patent No.: US 8,674,435 B2
(45) Date of Patent: Mar. 18, 2014

(54) SEMICONDUCTOR INTEGRATED CIRCUIT DEVICE AND METHOD OF MANUFACTURING THE SAME

(75) Inventors: Mi-Hyun Kang, Suwon-si (KR); Meung-Ryul Lee, Seoul (KR); Yong-Hoan Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 971 days.

(21) Appl. No.: 12/232,852

(22) Filed: Sep. 25, 2008

(65) Prior Publication Data
US 2009/0101990 A1   Apr. 23, 2009

(30) Foreign Application Priority Data
Sep. 28, 2007   (KR) .......................... 10-2007-0098160

(51) Int. Cl.
*H01L 29/66*   (2006.01)
(52) U.S. Cl.
USPC .................... 257/335; 257/E29.256; 438/283
(58) Field of Classification Search
None
See application file for complete search history.

(56) References Cited

U.S. PATENT DOCUMENTS

| | | | |
|---|---|---|---|
| 5,591,657 A | 1/1997 | Fujishima et al. | |
| 5,739,061 A | 4/1998 | Kitamura et al. | |
| 5,973,367 A * | 10/1999 | Williams | 257/365 |
| 6,677,210 B1 | 1/2004 | Hebert | |
| 6,946,705 B2 | 9/2005 | Kitaguchi | |
| 6,982,461 B2 * | 1/2006 | Hossain et al. | 257/341 |
| 7,898,027 B2 * | 3/2011 | Cheng | 257/337 |
| 2003/0067036 A1 * | 4/2003 | Depetro et al. | 257/335 |
| 2004/0079991 A1 * | 4/2004 | Lin et al. | 257/335 |
| 2006/0199344 A1 | 9/2006 | Tanaka | |
| 2007/0037353 A1 * | 2/2007 | Sutardja | 438/286 |

FOREIGN PATENT DOCUMENTS

JP   07-307401   11/1995
JP   2006-245517   9/2006

* cited by examiner

*Primary Examiner* — Benjamin Sandvik
(74) *Attorney, Agent, or Firm* — Lee & Morse, P.C.

(57) ABSTRACT

A semiconductor integrated circuit device includes a first dopant region in a semiconductor substrate, an isolation region on the semiconductor substrate, the isolation region surrounding the first dopant region, a gate wire surrounding at least a portion of the isolation region, and a plurality of second dopant regions arranged along at least a portion of the gate wire, the plurality of second dopant regions being spaced apart from each other, and the portion of the gate wire being between the first dopant region and a respective second dopant region.

16 Claims, 15 Drawing Sheets

SEMICONDUCTOR INTEGRATED CIRCUIT DEVICE AND METHOD OF MANUFACTURING THE SAME

BACKGROUND OF THE INVENTION

1. Field of the Invention

Example embodiments relate to a semiconductor integrated circuit device and to a manufacturing method of the same. More particularly, example embodiments relate to a semiconductor integrated circuit device having improved characteristics and to a method of manufacturing the semiconductor integrated circuit device.

2. Description of the Related Art

A semiconductor integrated circuit device may include a metal oxide semiconductors (MOS) power transistor, e.g., a lateral double diffused metal oxide semiconductor (LDMOS), an insulated gate bipolar transistor IGBT), and so forth, with a horizontal channel structure. The conventional horizontal channel, however, may have non-uniform length due to varying angles of ion implantation with respect to different doping regions and/or cross-sectional areas of the transistor components. A non-uniform length of the channel may cause an increase in leakage current and an irregular voltage operation. As a result, reliability of the semiconductor integrated circuit device may be decreased.

SUMMARY OF THE INVENTION

Example embodiments are therefore directed to a semiconductor integrated circuit device and to a manufacturing method of the same, which substantially overcome one or more of the disadvantages of the related art.

It is therefore a feature of an example embodiment to provide a semiconductor integrated circuit device with a uniform channel length.

It is another feature of an example embodiment to provide a method of manufacturing a semiconductor integrated circuit device with a uniform channel length.

At least one of the above and other features and advantages of the present invention may be realized by providing a semiconductor integrated circuit device, including a first dopant region in a semiconductor substrate, an isolation region on the semiconductor substrate, the isolation region surrounding the first dopant region, a gate wire surrounding at least a portion of the isolation region, and a plurality of second dopant regions arranged along at least a portion of the gate wire, the plurality of second dopant regions being spaced apart from each other, and the portion of the gate wire being between the first dopant region and a respective second dopant region.

The gate wire may surround the entire isolation region. The gate wire may include a plurality of linear regions, the second dopant regions being arranged along two or more of the linear regions. The gate wire may have a polygonal shape, the second dopant regions being arranged along two or more sides of the polygonal shape. The gate wire may include at least two linear regions facing each other, the second dopant regions being arranged in at least one of the linear regions. The gate wire may include two linear regions facing each other and extending along a lengthwise direction of the gate wire, the second dopant regions being arranged only in portions of the two linear regions extending along the lengthwise direction of the gate wire. The gate wire may include two first linear regions extending along a first direction and two second linear regions extending along a second direction perpendicular to the first direction, the second dopant regions being arranged only in portions of the two linear regions extending along the first and second directions. The first dopant region may be a drain region, and the second dopant region may be a source region. The first and second dopant regions may have a substantially same conductivity type. The first and second dopant regions may have different conductivity types.

At least one of the above and other features and advantages of the present invention may be realized by providing a semiconductor integrated circuit device, including a first a drain region in a semiconductor substrate, an isolation region on the semiconductor substrate, the isolation region surrounding the drain region, a gate wire surrounding at least a portion of the isolation region, the gate wire being external to the isolation region and including at least one pair of linear regions facing each other, and at least one pair of source regions arranged along the pair of linear regions of the gate wire, the pair of source regions being arranged to face each other. The gate wire may include first and second gate wires, the first and second gate wires being parallel to each other along a first direction, and the drain region may be between the first gate wire and the second gate wire. The gate wire may include third and fourth gate wires, the third and fourth gate wires being parallel to each other along a second direction different than the first direction, and the drain region may be between the third gate wire and the fourth gate wire.

At least one of the above and other features and advantages of the present invention may be realized by providing a method of manufacturing a semiconductor integrated circuit device, including forming an isolation region on a substrate, such that the isolation region may surround a portion of the semiconductor substrate to define a first active region in the semiconductor substrate, forming a gate wire to surround at least a portion of the isolation region, forming a first dopant region in the first active region, and forming a plurality of second dopant regions spaced apart from each other, the second dopant being arranged along at least a portion of the gate wire, such that the gate wire may be between the first dopant region and a respective second dopant region.

The gate wire may be formed to surround the entire isolation region. The gate wire may be formed to include a plurality of linear regions, the second dopant regions being formed along two or more of the linear regions. The gate wire may include at least two linear regions facing each other, the second dopant regions being arranged in at least one of the linear regions. The first dopant region may be formed to be a drain region, and the second dopant region may be formed to be a source region. The gate wire may be formed only along a portion of the isolation region and may include first and second gate wires formed in parallel to each other, the drain region being formed between the first gate wire and the second gate wire. The method may further include, before forming the isolation region, forming a first conductive type well in the semiconductor substrate, such that the first conductive type well may be under the first active region, and forming a second conductive type dopant region around the first conductive type well, the second conductive type dopant region being horizontally spaced a part from the first conductive type well.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
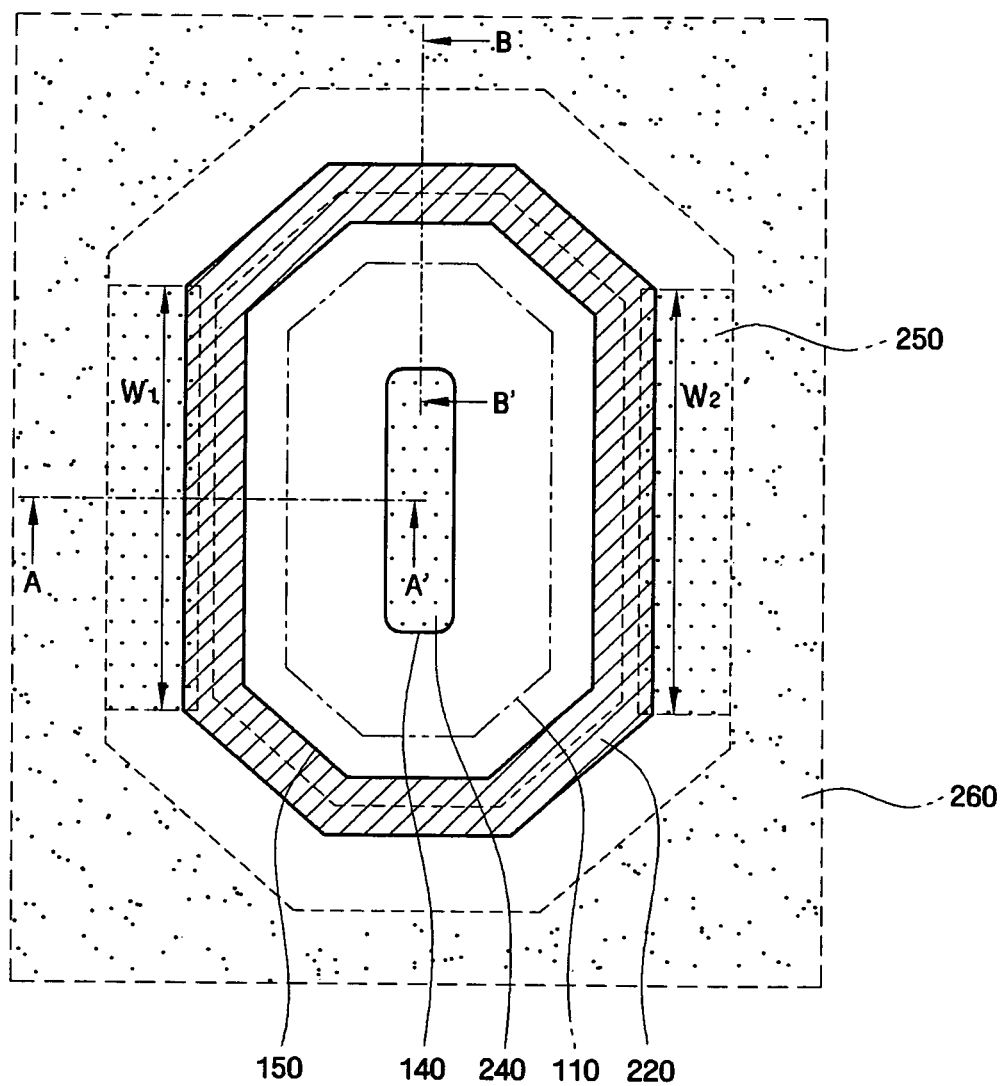
FIG. 1 illustrates a schematic plan layout of a semiconductor integrated circuit device according to an example embodiment.

Korean Patent Application No. 10-2007-0098160, filed on Sep. 28, 2007, in the Korean Intellectual Property Office, and entitled: "Semiconductor Integrated Circuit Device and Method of Manufacturing the Same," is incorporated by reference herein in its entirety.

Example embodiments will now be described more fully hereinafter with reference to the accompanying drawings, in which embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will also be understood that when a layer or element is referred to as being "between" two layers or elements, it can be the only layer or element between the two layers or elements, or one or more intervening layers and/or elements may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Spatially relative terms, such as "beneath", "below", "lower", "above", "upper", and the like, may be used herein for ease of description to describe a relationship of one element or feature to another element(s) and/or feature(s) with respect to the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions in the figures have schematic properties and shapes intended to exemplify specific shapes of regions of elements and not limit aspects of the invention.

Figure 2:
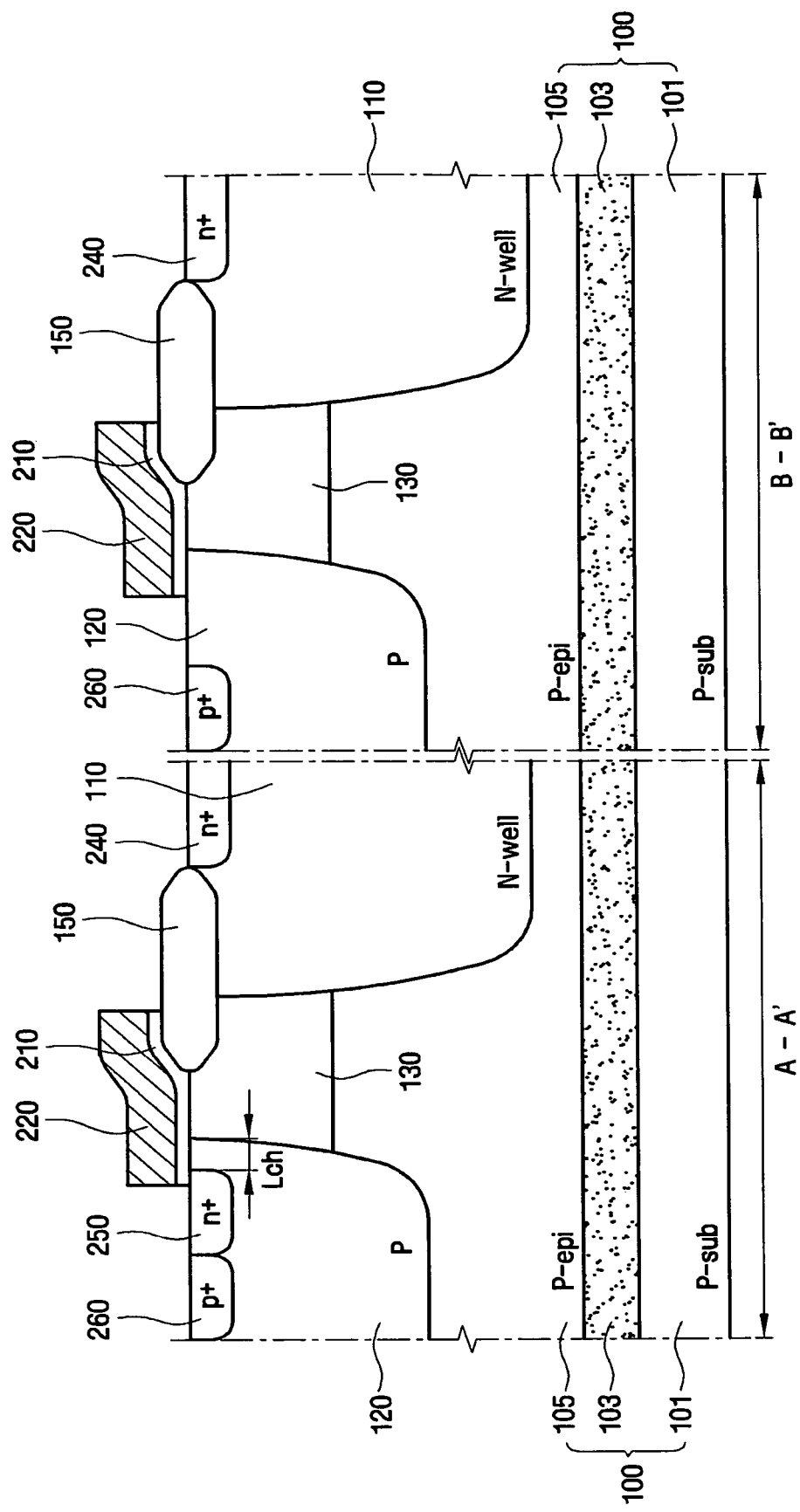
FIG. 2 illustrates cross-sectional views along lines A-A' and B-B' of FIG. 1.

A semiconductor integrated circuit device according to an example embodiment will be described hereinafter with reference to FIGS. 1 and 2A-2B. FIG. 1 illustrates a schematic plan layout of a semiconductor integrated circuit device according to an example embodiment, and FIG. 2 illustrates cross-sectional views along lines A-A' and B-B' of FIG. 1. As illustrated in FIGS. 1-2, a semiconductor integrated circuit device may include a lateral high-voltage transistor. It is noted that even though FIGS. 1-2 illustrate a LDMOS transistor structure, other lateral high-voltage transistor structures, e.g., a IGBT transistor, are within the scope of the present invention. It is further noted that even though an N-type LDMOS transistor of a semiconductor integrated circuit device is illustrated in FIGS. 1-2, a P-type LDMOS transistor is also within the scope of the present invention.

Referring to FIGS. 1-2, a semiconductor integrated circuit device according to example embodiments may include a transistor, e.g., a LDMOS transistor, on a semiconductor substrate 100. In particular, an isolation region 150 may define a first active region 140, and the transistor, e.g., LDMOS transistor, may include a gate wire 220 surrounding the isolation region 150, an N-type well 110 under a portion of the isolation region 150, an N-type dopant region 240 in the first active region 140, a plurality of N-type second dopant regions 250 along sides of the gate wire 220, P-type first dopant regions 260 along sides of the N-type second dopant regions 250, and a P-type second dopant region 120 under the N-type second dopant regions 250 and under the P-type first dopant regions 260.

The semiconductor substrate 100 may be any suitable semiconductor substrate, e.g., a semiconductor on insulator (SOI) substrate, a silicon semiconductor substrate, a gallium arsenic semiconductor substrate, a silicon germanium semiconductor substrate, a ceramic semiconductor substrate, a quartz semiconductor substrate, a glass semiconductor substrate, and so forth. As illustrated in FIG. 2, the semiconductor substrate 100 may include a lower semiconductor substrate 101, an insulating layer 103 on the lower semiconductor substrate 101, and an epitaxial layer 105 on the insulating layer 103. As further illustrated in FIG. 2, the lower semiconductor substrate 101 and the epitaxial layer 105 may be P-type layers. It is noted, however, that N-type lower semiconductor substrate and epitaxial layer are within the scope of the present invention.

The isolation region 150 may be formed on the substrate 100, and may have a closed structure to define an isolated first active region 140, e.g., the isolation region 150 may have a polygonal cross-section in a plane parallel to the substrate 100. For example, as illustrated in FIG. 1, the isolation region 150 may have a cross-section of an octagonal ring in a plane parallel to the substrate 100, so the first active region 140 may be surrounded by the isolation region 150, i.e., an entire perimeter of the first active region 140 may be completely surrounded by the isolation region 150 in the plane parallel to the substrate. For example, as further illustrated in FIG. 1, the first active region 140 may be configured to be in a center of the octagonal ring of the isolation region 150, so a lengthwise direction of the first active region 140 may be parallel to a lengthwise direction of the isolation region 150. It is noted, however, that other configurations of the first active region 140 with respect to the isolation region 150, e.g., the isolation region 150 may have any suitable shape having a closed cross-section capable of surrounding the first active region 140, are within the scope of the present invention.

The gate wire 220 may be on the substrate 100, and may surround the isolation region 150. For example, the gate wire 220 may have a substantially same structure as the isolation region 150, i.e., octagonal cross-section. It is noted, however, that the gate wire 220 may have any suitable closed cross-sectional structure capable of surrounding the isolation region 150, e.g., completely surround an entire perimeter of the isolation region 150 in a plane parallel to the substrate 100. As illustrated in FIG. 2, the gate wire 220 may partially overlap the isolation region 150, so a portion of the gate wire 220 may be on an upper surface of the isolation region 150, i.e., a surface facing away from the insulating layer 103. As further illustrated in FIG. 2, a gate insulating film 210 may be formed between the semiconductor substrate 100 and the gate wire 220, so the gate insulating film 210 and the gate wire 220 may completely overlap. The gate insulating film 210 may be formed of any suitable material, e.g., polysilicon, a conductive material, such as a metal and/or a compound of metal, and so forth.

The N-type first dopant region 240 may be formed in the first active region 140, as illustrate in FIG. 1. The N-type first dopant region 240 may be formed at a high density, and may function as a drain region. Accordingly, the drain region of the transistor may be surrounded and isolated by the isolation region 150. As illustrated in FIG. 2, the N-type first dopant region 240 and the isolation region 150 may be adjacent to each other on an upper most surface of the substrate 100.

The N-type well 110 may be formed at a predetermined depth under the first active region 140 and under a portion of the isolation region 150, as illustrated in FIGS. 1-2. In particular, the N-type first dopant region 240 and a portion of the isolation region 150 immediately adjacent to the N-type first dopant region 240 may be directly on the N-type well 110. The N-type well 110 may have a lower density than the N-type first dopant region 240, and may function as a drift region with an adjacent N-type third dopant region 130. The N-type third dopant region 130 may extend from the epitaxial layer 105 toward the wire gate 220, so the N-type third dopant region 130 and the wire gate 220 may substantially overlap. It is noted that an N-type LDMOS transistor, as illustrated in FIGS. 1-2, may include a P-type epitaxial layer 105 with the N-type third dopant region 130 and the N-type well 110. If, however, an N-type epitaxial layer is used, the N-type third dopant region 130 and/or the N-type well 110 may be omitted.

The N-type second dopant regions 250 may be arranged along sides of the gate wire 220. For example, as illustrated in FIG. 1, the N-type second dopant regions 250 may extend along a lengthwise direction of the gate wire 220, i.e., along longest sides of the octagonal gate wire 220, and may be parallel to each other. The N-type second dopant regions 250 may be spaced apart from each other, i.e., one N-type second dopant region 250 may be non-continuous with respect to another N-type second dopant region 250 to have a predetermined interval therebetween, e.g., each N-type second dopant region 250 may be positioned along a different portion of the gate wire 220. The N-type second dopant regions 250 may be positioned so the gate wire 220 may be between the N-type first dopant region 240 and a respective N-type second dopant region 250. The N-type second dopant region 250 may be formed at a higher density than the N-type well 110, and may function as a source region.

The P-type first dopant region 260 may be formed along sides of the N-type second dopant region 250. For example, as illustrated in cross section AA' of FIG. 2, the P-type first dopant region 260 may be immediately adjacent to the N-type second dopant region 250, so the N-type second dopant region 250 may be between the isolation region 150 and the P-type first dopant region 260. As further illustrated in FIG. 2, upper surfaces of the P-type first dopant region 260 and the N-type second dopant region 250 may be substantially coplanar. The P-type first dopant region 260 may be formed at a high density, and may function as a source contact region.

It is noted that even though the P-type first dopant region 260 may be formed only along the N-type second dopant region 250, other configurations of the P-type first dopant region 260 are within the scope of the present invention. For example, as illustrated in FIG. 1, the P-type first dopant region 260 may completely surround the gate wire 220. Accordingly, the P-type second dopant region 120 may be between the P-type first dopant region 260 and the isolation region 150 in regions including short sides of the gate wire 220, as illustrated in cross section BB' of FIG. 2.

The P-type second dopant region 120 may be formed under the N-type second dopant region 250 and the P-type first dopant region 260. In particular, as illustrated in FIG. 2, the P-type second dopant region 120 may extend from the epitaxial layer 105 in an upward direction toward the N-type second dopant region 250 and the P-type first dopant region 260.

As further illustrated in FIG. 2, a first portion of the P-type second dopant region 120 may be under the wire gate 220 and between the N-type second and third dopant regions 250 and 130. A channel region may be defined in the first portion of the P-type second dopant region 120. In particular, as illustrated in cross-section AA' of FIG. 2, a channel length Lch may be defined as a distance between a first interface, i.e., an interface of the P-type second dopant region 120 and N-type third dopant region 130, and a second interface, i.e., an interface of the P-type second dopant region 120 and the N-type second dopant region 250.

Since the N-type second dopant regions 250 are formed only along the two longest sides of the gate wire 220 in example embodiments, the channel may be defined only along the two longest sides of the gate wire 220. In other words, the semiconductor integrated circuit device according to example embodiments may include a channel region along each of the two longest sides of the gate wire 220, so the two channel regions may face each other and may be oriented along a substantially same direction. Formation of a semiconductor integrated circuit device with channels only along the two longest sides of the gate wire 220 may facilitate a substantially uniform length of the channels. In particular, an effect of the semiconductor integrated circuit device according to example embodiment will be described in more detail hereinafter with reference to FIGS. 1-3.

Figure 3:
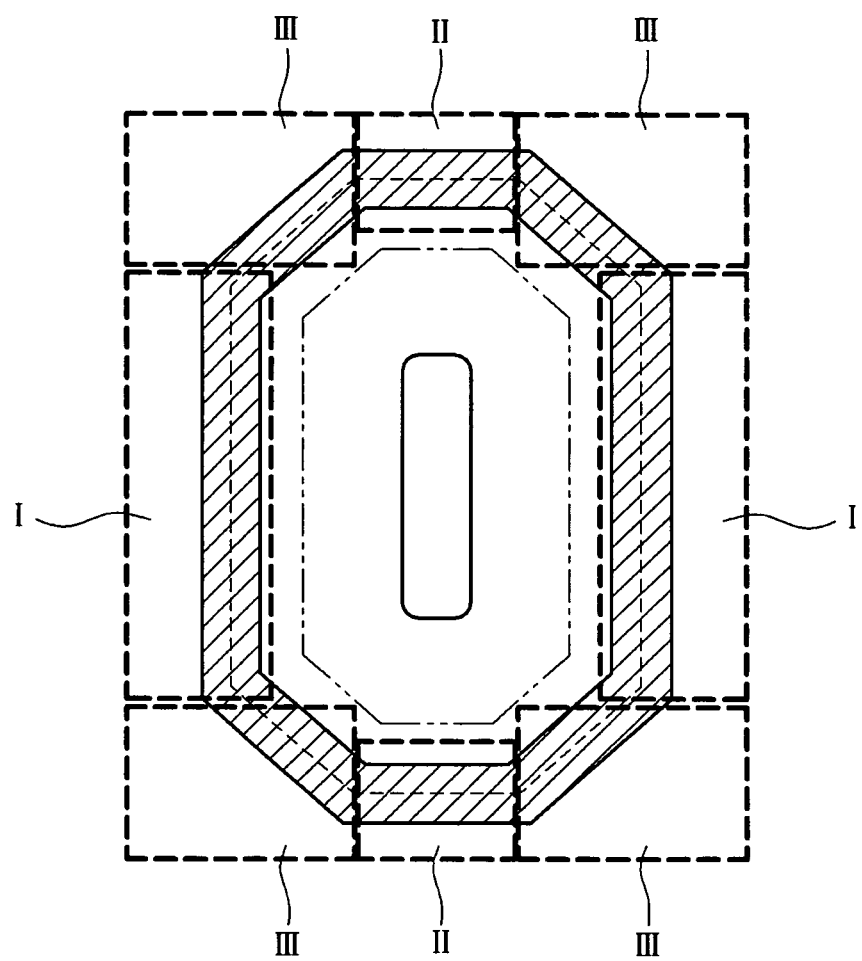
FIG. 3 illustrates a schematic planar diagram of regions in a semiconductor integrated circuit device according to an example embodiment.

For convenience of explanation, FIG. 3 illustrates regions I-III in the semiconductor integrated circuit device. In particular, regions I refer to regions including the two longest sides of the gate wire 220, i.e., regions extending between the N-type third dopant region 130 to the P-type first dopant region 260. Regions II refer to regions including short sides of the gate wire 220, i.e., regions including portions of gate wire 220 oriented perpendicularly to regions I. Regions III refer to regions including short sides of the gate wire 220 that are beveled with respect to the long sides of the gate wire 220.

Referring to FIGS. 1-3, the N-type second dopant region 250 and the channel may be formed only in regions I. In detail, the N-type second dopant region 250, i.e. a source region formed only at a portion along the long sides of the gate wire 220, may be formed only in regions I, and may have a length, e.g., substantially equal to a length of a corresponding long side of the gate wire 220. The channel may be formed along the N-type second dopant region 250, so the channel may be formed only in regions I and may have a width substantially equal to a length of a corresponding N-type second dopant region 250. For example, as illustrated in FIG. 1, a first channel along one N-type second dopant region 250 may have a first width W1 and a second channel along another N-type second dopant region 250 may have a second width W2. Accordingly, a total width of the channel may equal W1+W2.

It is noted that even though the channel is formed only along the two longest sides of the gate wire 220, i.e., only in regions I, and therefore, its width may be smaller than a width of a channel surrounding the entire perimeter of the gate wire 220, the length Lch of the channel according to example embodiment may be substantially uniform. In contrast, when a conventional N-type second dopant region and a conventional channel are formed to surround the entire gate wire 220, i.e., in regions I, II, and III, dopant ions may be implanted at varying angles into the substrate, e.g., the angle of ion implantation may vary with respect to a shape or a curvature of the transistor components, so a distance between the conventional source region and the low-density dopant region may be non-uniform. A non-uniform distance between the source region and the low-density dopant region may cause a non-uniform channel length.

Accordingly, formation of the channel only along portions having a substantially uniform orientation according to exemplary embodiments may facilitate defining a substantially uniform length Lch of the channel. Therefore, formation of the channel only within region I along the N-type second dopant regions 250, which are formed only along the two longest sides of the gate wire 220 that are parallel to each other, may provide channels with a substantially uniform length, thereby improving electrical characteristics thereof. In particular, formation of a channel with a substantially uniform length may reduce leakage current and improve regularity of operational voltage of the transistor. Further, when forming the gate wire 220 to have the longest sides, i.e., sides in region I, as long as possible and the sides corresponding to regions II and regions III as short as possible, resistance caused by the reduced width of the channel region may be substantially minimized.

A method of manufacturing the semiconductor integrated circuit device of FIGS. 1-2 will be described hereinafter with reference to FIGS. 1 and 4A-5B.

Figure 4A:
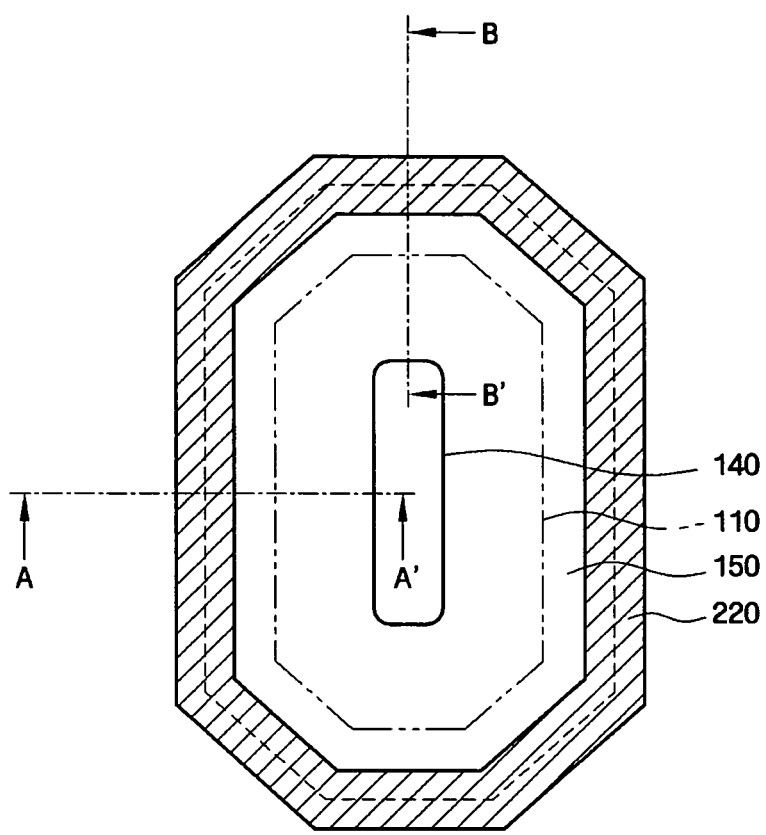
FIGS. 4A-5B illustrate views of a method of manufacturing the semiconductor integrated circuit device of FIG. 1.
Figure 4B:
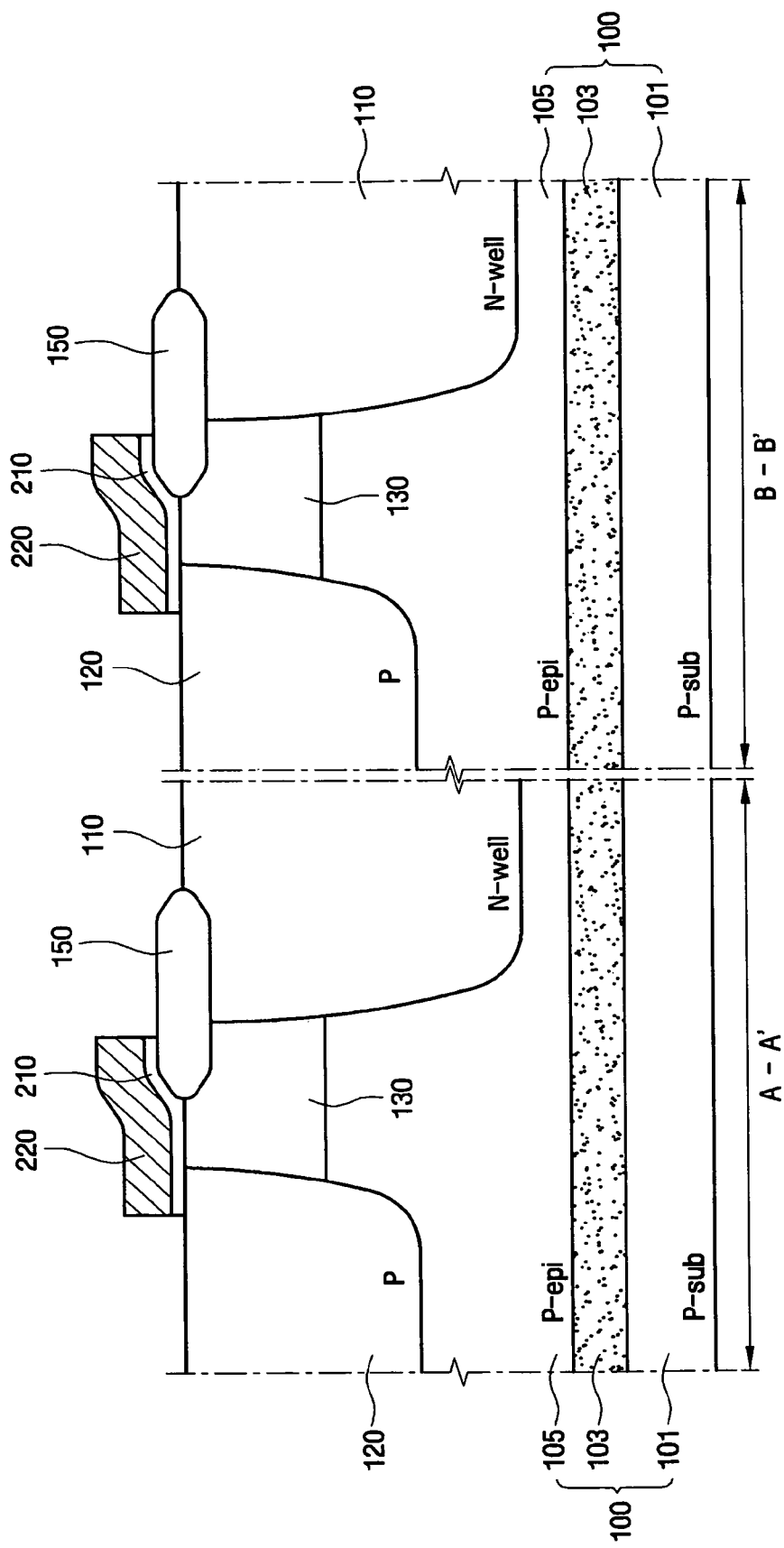

Referring to FIGS. 4A-4B, the isolation region 150 and the gate wire 220 may be formed on the semiconductor substrate 100. The semiconductor substrate 100 may be an SOI substrate including the semiconductor lower substrate 101, the insulating layer 103, and the epitaxial layer 105, e.g., a P-type epitaxial layer. The isolation region 150 may be formed on the semiconductor substrate 100 to define the first active region 140 on the semiconductor substrate 100, such that the first active region 140 may be surrounded by the isolation region 150. The gate wire 220 may be formed around the isolation region 150, such that a portion of the gate wire 220 may overlap a portion of the isolation region 150.

The N-type well 10 may have a low density, and may be formed under the first active region 140 and under a portion of the isolation region 150 in the semiconductor substrate 100. The P-type second dopant region 120 with a P-type dopant may be formed along a side of the gate wire 220 in the semiconductor substrate 100, so the gate wire 220 may be between the P-type second dopant region 120 and the first active region 140. The N-type third dopant region 130 may connect the P-type second dopant region 120 with the N-type well 110, and may be formed at the upper portion of the semiconductor substrate 100. It is noted, however, that the N-type well 110 and the N-type third dopant region 130 may be omitted if an N-type epitaxial layer is used.

Figure 5A:
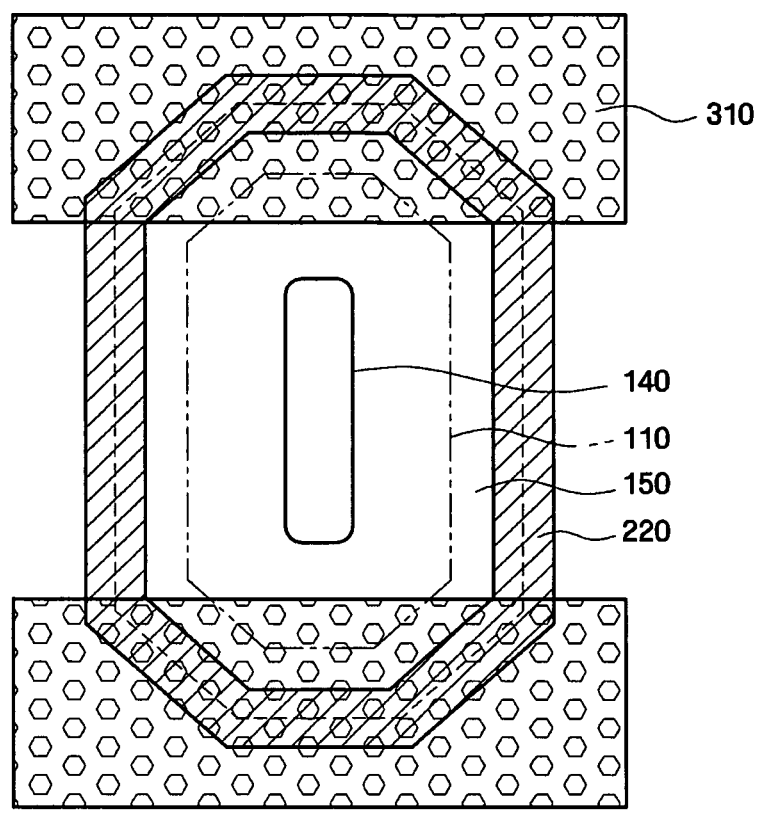
Figure 5B:
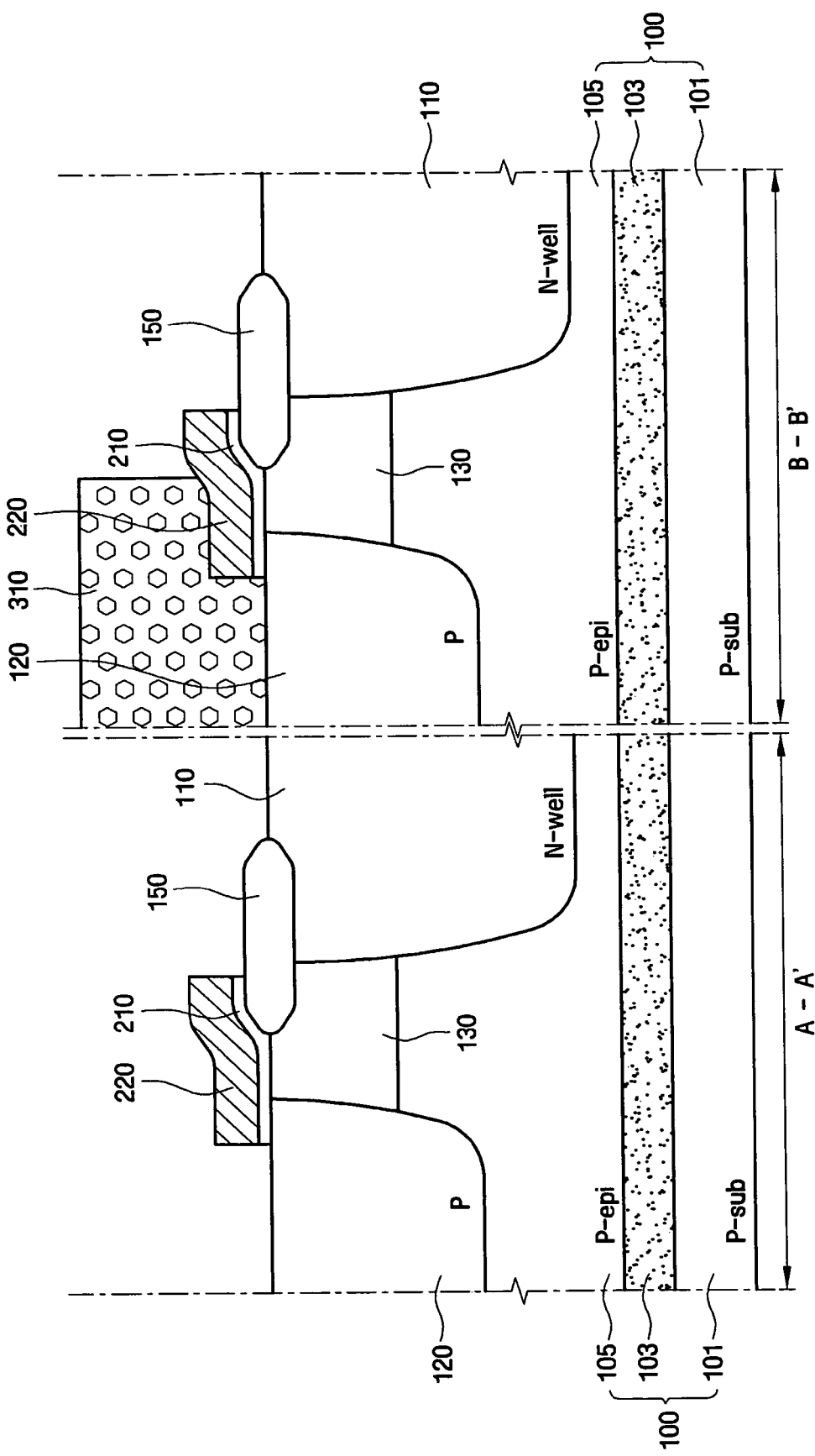

Referring to FIGS. 3 and 5A-5B, mask patterns 310 may be formed on predetermined regions, i.e., regions II and III illustrated in FIG. 3, of the gate wire 220. N-type high density ion implantation may be applied to portions of the semiconductor substrate 100 not covered by the mask patterns 310. Accordingly, N-type high density ion implantation may be applied only to regions I and to the active region 140. Therefore, the N-type first dopant region 240 may be formed on the first active region 140 and the N-type second dopant region 250 may be formed in regions I along sides of the gate wire 220.

Since the N-type high density ion implantation is applied only to region I, the channel region may be defined only in region I by the N-type second dopant region 250 arranged along the long sides of the gate wire 220. When ion implantation is complete, the mask patterns 310 may be removed to complete the transistor.

Figure 6:
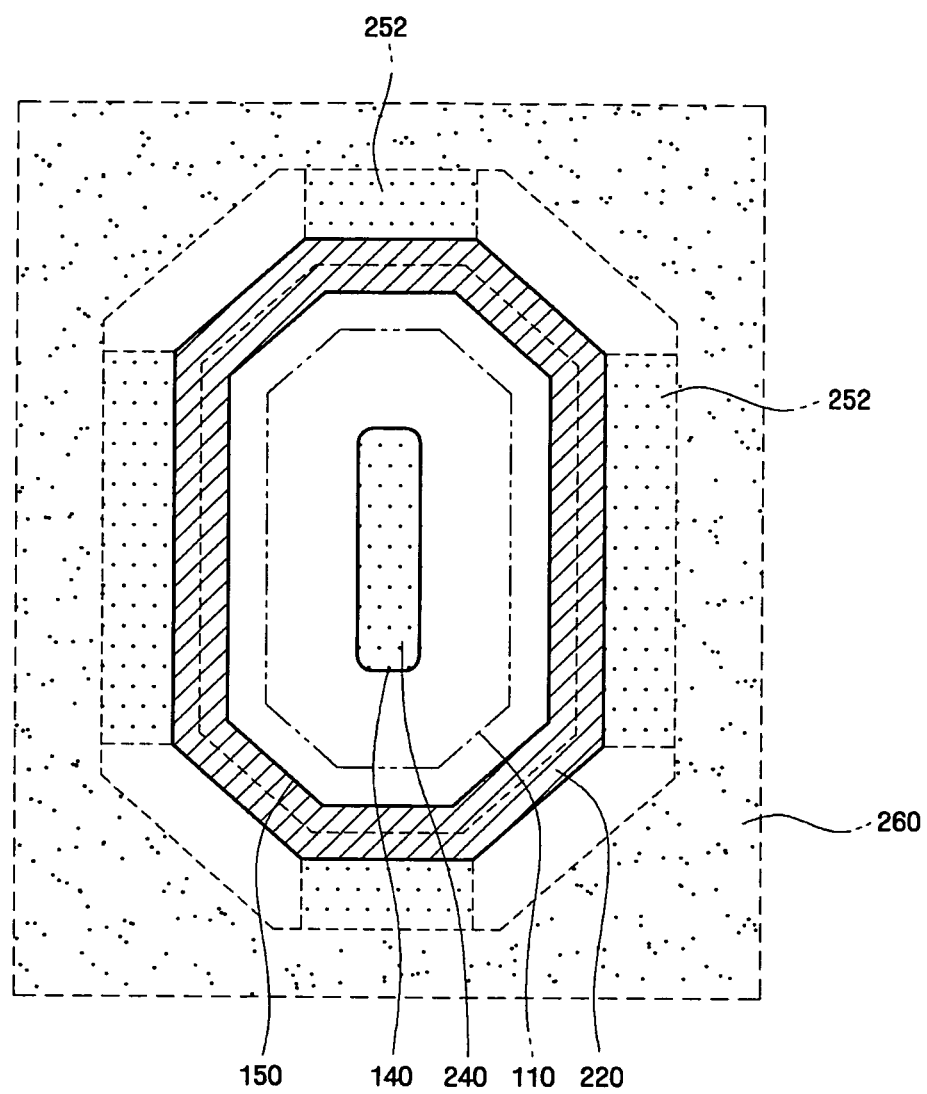
FIG. 6 illustrates a schematic plan layout of a semiconductor integrated circuit device according to another example embodiment of the invention.

A semiconductor integrated circuit device according to another example will be described hereinafter with reference to FIGS. 3 and 6. Referring to FIGS. 3 and 6, a semiconductor integrated circuit device may be substantially the same as the semiconductor integrated circuit device described with reference to FIGS. 1-2, with the exception of including N-type second dopant regions 252. The N-type second dopant regions 252 may be substantially the same as the N-type second dopant regions 250 of FIGS. 1-2, with the exception that the N-type second dopant regions 252 may be formed in region I and in region II of the semiconductor substrate 100.

In the semiconductor integrated circuit device of FIG. 6, only regions III may not include N-type second dopant because corner regions of the semiconductor substrate 100 may have increased deterioration characteristics, and may substantially increase non-uniformity of the channel length. Therefore, the semiconductor integrated circuit device described with reference to FIG. 6 may have increased channel width, i.e., by forming the N-type second dopant regions 252 both in regions I and II, and may substantially improve the characteristics of the semiconductor integrated circuit device.

Figure 7:
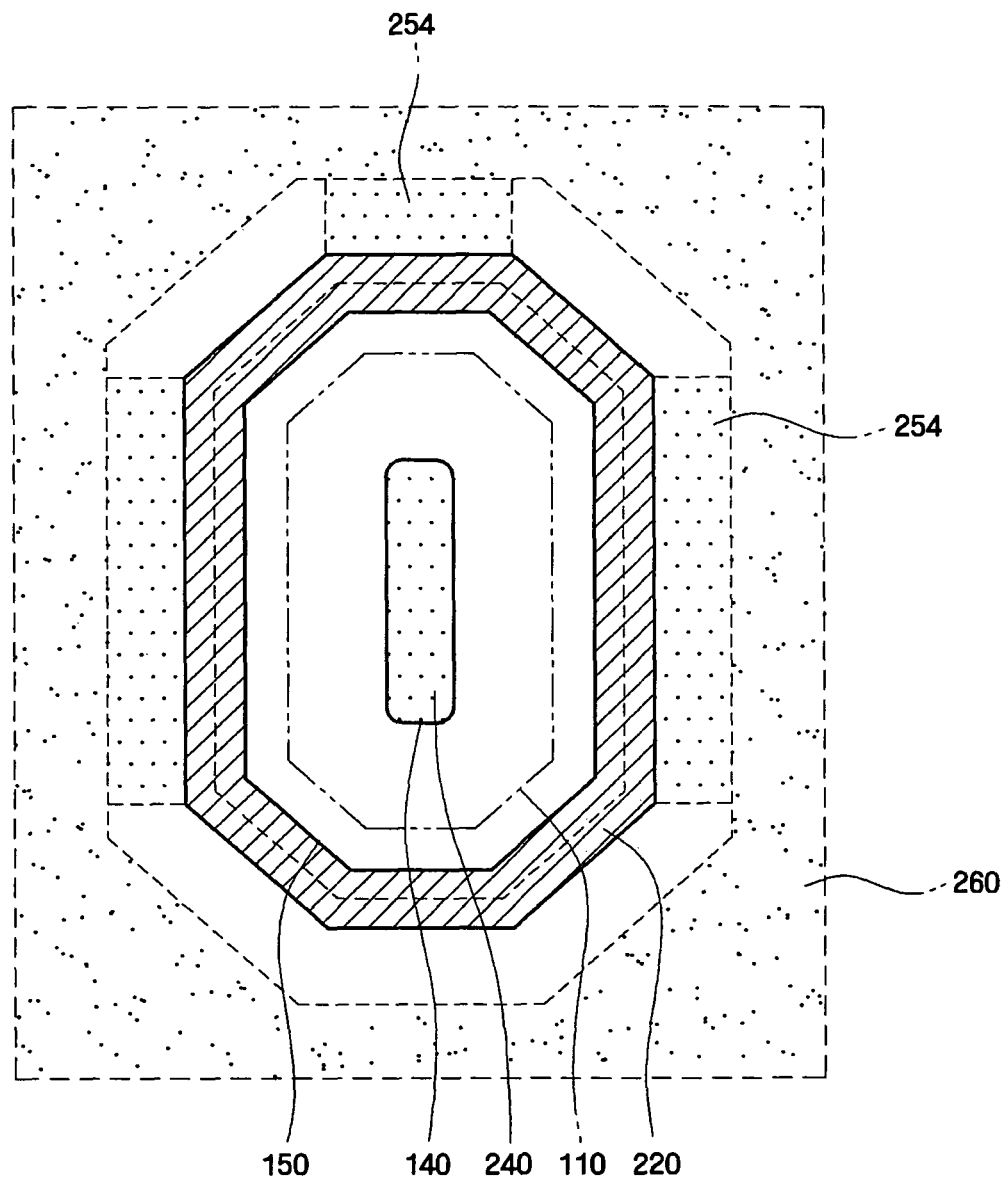
FIG. 7 illustrates a schematic plan layout of a semiconductor integrated circuit device according to another example embodiment of the invention.

A semiconductor integrated circuit device according to another example embodiment will be described hereinafter with reference to FIGS. 3 and 7. Referring to FIGS. 3 and 7, a semiconductor integrated circuit device may be substantially the same as the semiconductor integrated circuit device described with reference to FIG. 6, with the exception of including N-type second dopant regions 254. The N-type second dopant regions 254 may be substantially the same as the N-type second dopant regions 252 described with reference to FIG. 6, with the exception that the N-type second dopant regions 254 may be formed in regions I and in only a portion of regions II of the semiconductor substrate 100. In other words, a size of the N-type second dopant regions 254 in regions II of FIG. 7 may be smaller than a size of the N-type second dopant regions 252 in region II of FIG. 6. The N-type second dopant regions 254 may be selectively formed only in portions of region II exhibiting more stable characteristics with respect to a direction of ion implantation.

Figure 8:
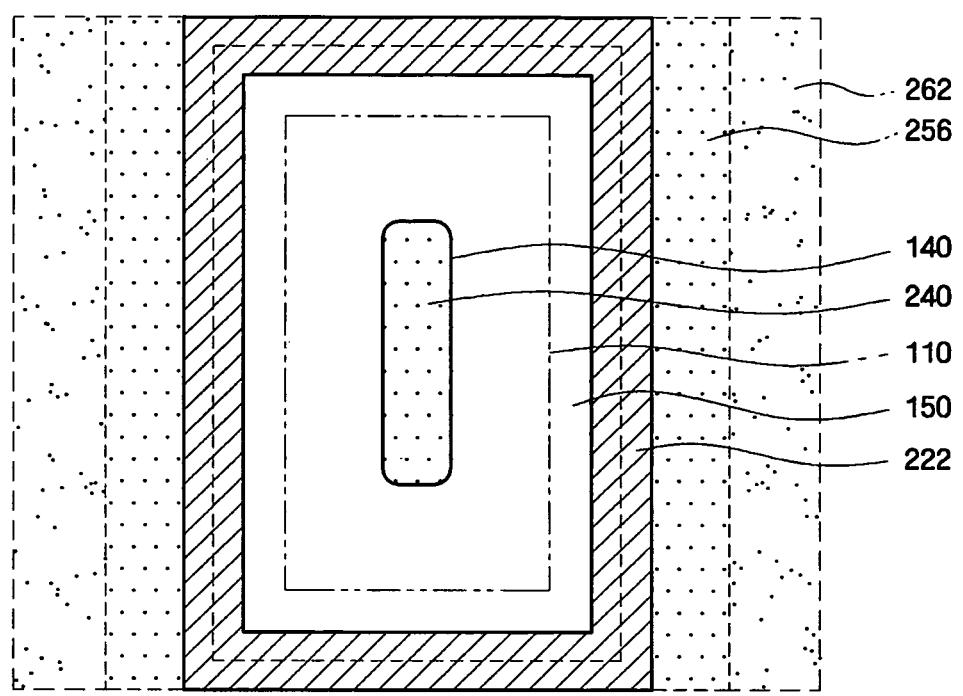
FIG. 8 illustrates a schematic plan layout of a semiconductor integrated circuit device according to another example embodiment of the invention.

A semiconductor integrated circuit device according to another example embodiment will be described hereinafter with reference to FIGS. 3 and 8. Referring to FIGS. 3 and 8, a semiconductor integrated circuit device may be substantially the same as the semiconductor integrated circuit device described with reference to FIGS. 1-2, with the exception of including a gate wire 222 and N-type second dopant regions 256. The gate wire 222 may be substantially the same as the gate wire 220 of FIGS. 1-2, with the exception that a cross section of the gate wire 222 may be rectangular. The N-type second dopant regions 256 may be positioned along the two longest sides of the gate wire 222. An increase of length of the gate wire 222 along a lengthwise direction, i.e., increased length of the two longest sides of the gate wire 222, may increase a width of the channels along the lengthwise direction of the gate wire 222. When the gate wire 222 has a rectangular cross-section and the N-type second dopant regions 256 are formed along the longer sides of the gate wire 222, an overall area of the N-type second dopant regions 256 may be increased.

Figure 9:
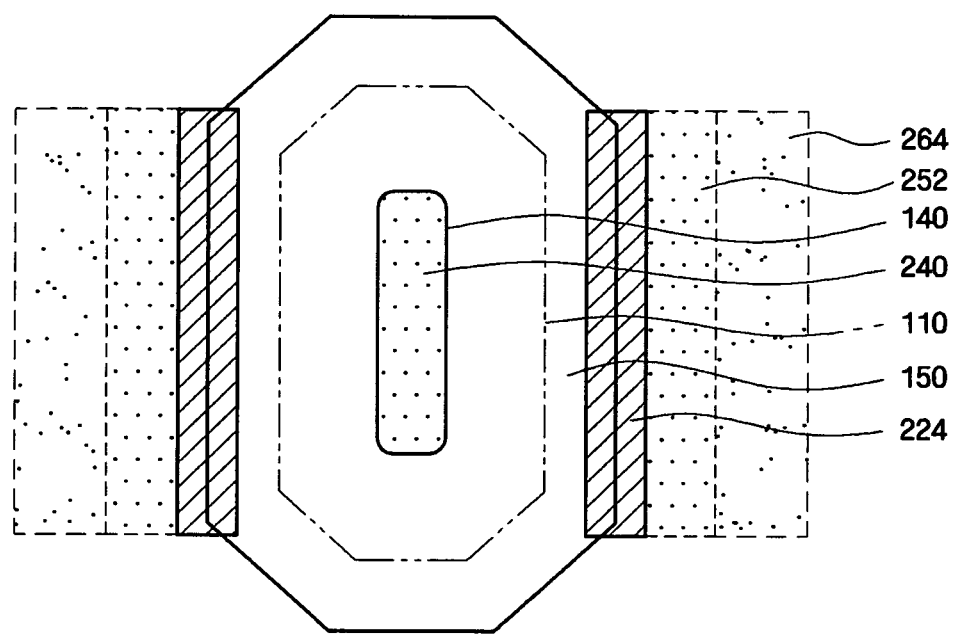
FIG. 9 illustrates a schematic plan layout of a semiconductor integrated circuit device according to another example embodiment of the invention.

A semiconductor integrated circuit device according to another example embodiment will be described hereinafter with reference to FIGS. 3 and 9. Referring to FIGS. 3 and 9, a semiconductor integrated circuit device may be substantially the same as the semiconductor integrated circuit device described with reference to FIG. 1-2, with the exception of including gate portions 224. The gate portions 224 may be separate from each other, i.e., non-continuous portions, formed only in regions I along two facing sides of the first active region 140, as illustrated in FIG. 9. That is, the gate portions 224 may be formed only in regions where the N-type second dopant regions 252 are to be formed. Accordingly, the channels may be formed only in regions I.

Figure 10:
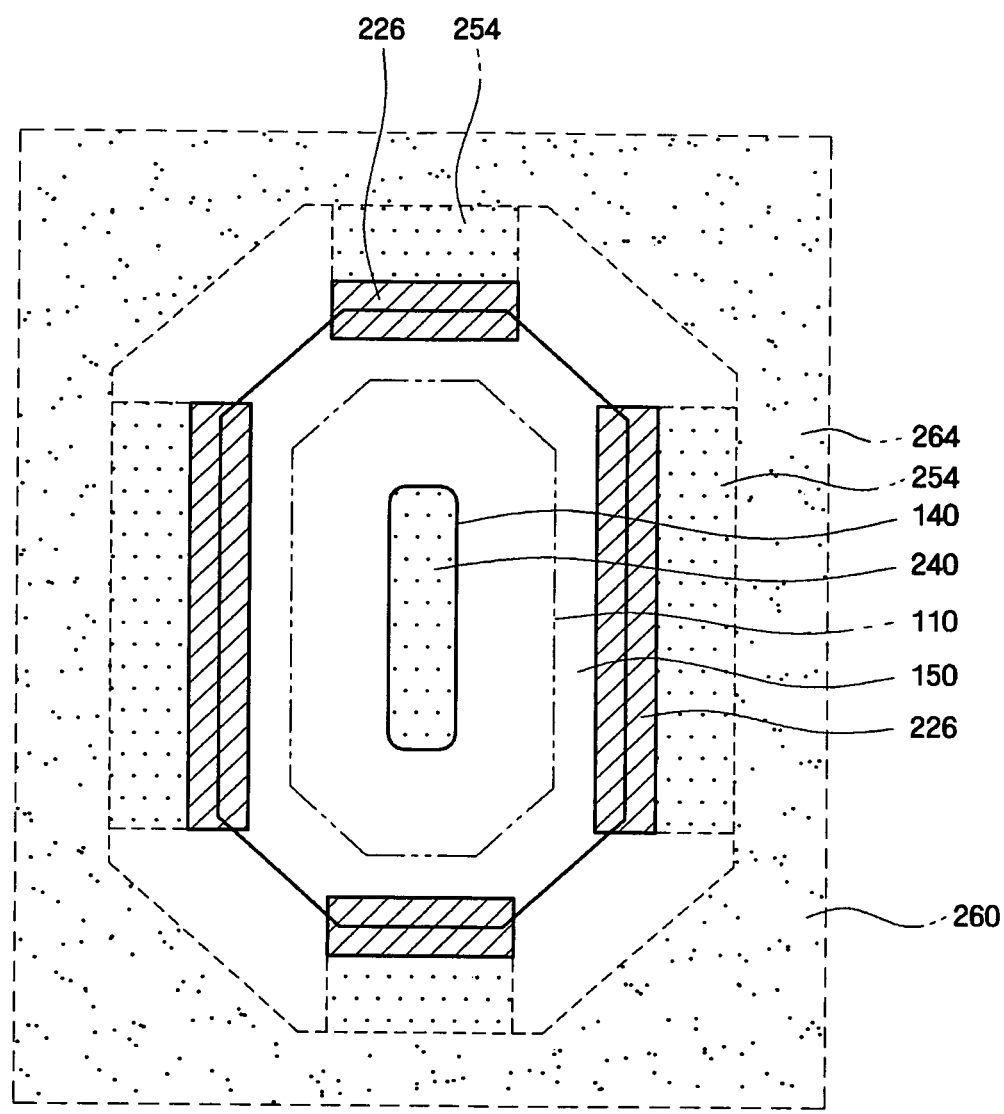
FIG. 10 illustrates a schematic plan layout of a semiconductor integrated circuit device according to another example embodiment of the invention.

A semiconductor integrated circuit device according to another example embodiment will be described hereinafter with reference to FIGS. 3 and 10. Referring to FIGS. 3 and 10, a semiconductor integrated circuit device may be substantially the same as the semiconductor integrated circuit device described with reference to FIG. 9, with the exception of including gate portions 226. The gate portions 226 may be formed only in regions I and II, as illustrated in FIG. 10, so the N-type second dopant regions 254 may be formed along the gate portions 226 in regions I and II.

Figure 11:
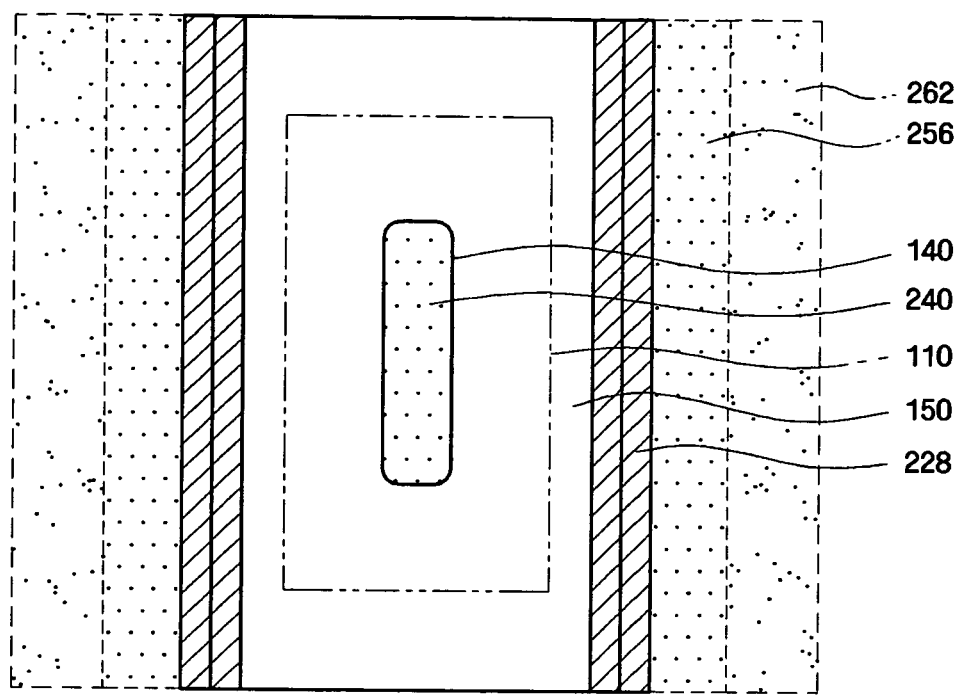
FIG. 11 illustrates a schematic plan layout of a semiconductor integrated circuit device according to another example embodiment of the invention.

A semiconductor integrated circuit device according to another example embodiment will be described hereinafter with reference to FIGS. 3 and 11. Referring to FIGS. 3 and 11, a semiconductor integrated circuit device may be substantially the same as the semiconductor integrated circuit device described with reference to FIG. 8, with the exception of including gate portions 228. The isolation region 150 may have a rectangular shape, and the gate portions 228 may be formed only along long sides of the isolation region 150, so the N-type second dopant regions 256 may be formed along the gate portions 228.

Figure 12:
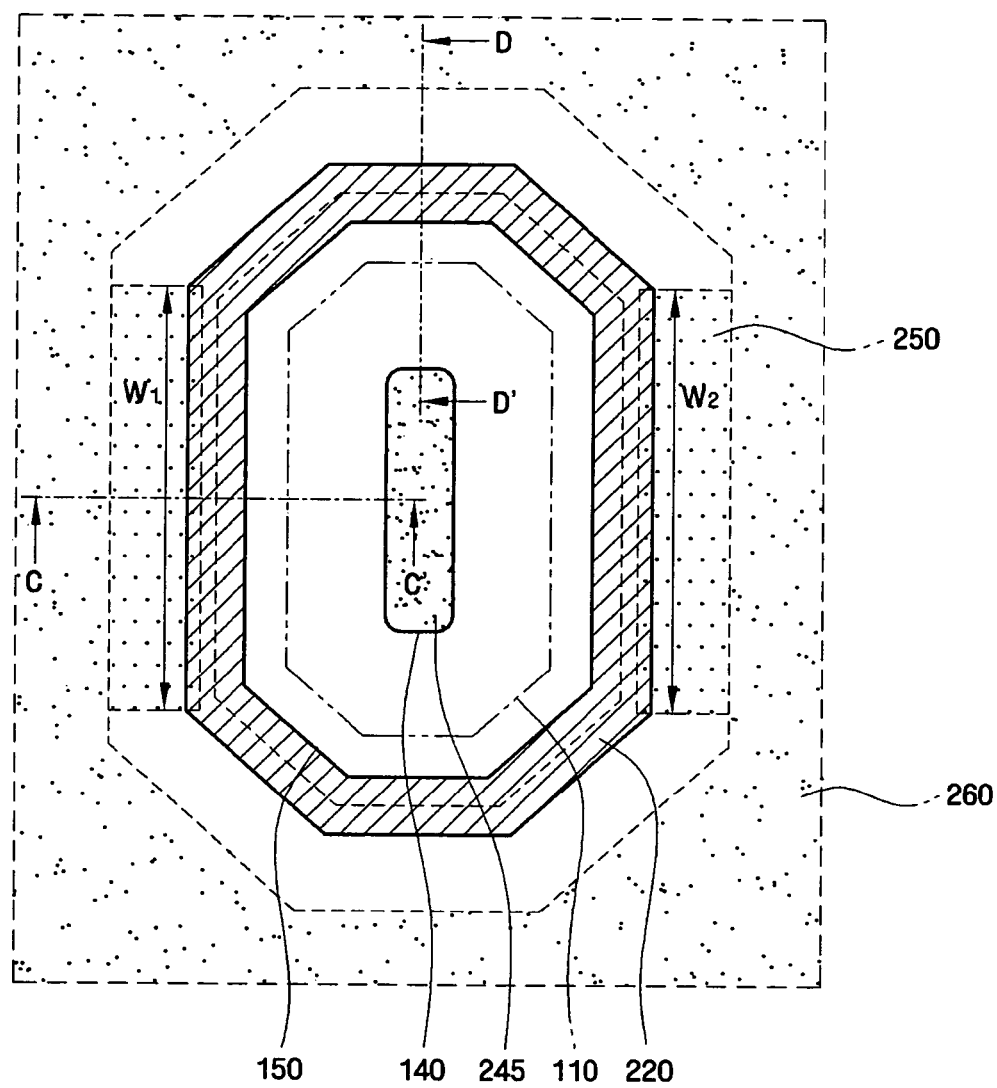
FIGS. 12-13 illustrate schematic plan layout and a cross sectional view, respectively, of a semiconductor integrated circuit device according to another example embodiment.

A semiconductor integrated circuit device according to another example embodiment will be described hereinafter with reference to FIGS. 12-13. FIG. 12 illustrates a schematic planar view of a semiconductor integrated circuit device according to another example embodiment, and FIG. 13 illustrates cross-sectional views along lines C-C' and D-D', respectively.

Figure 13:
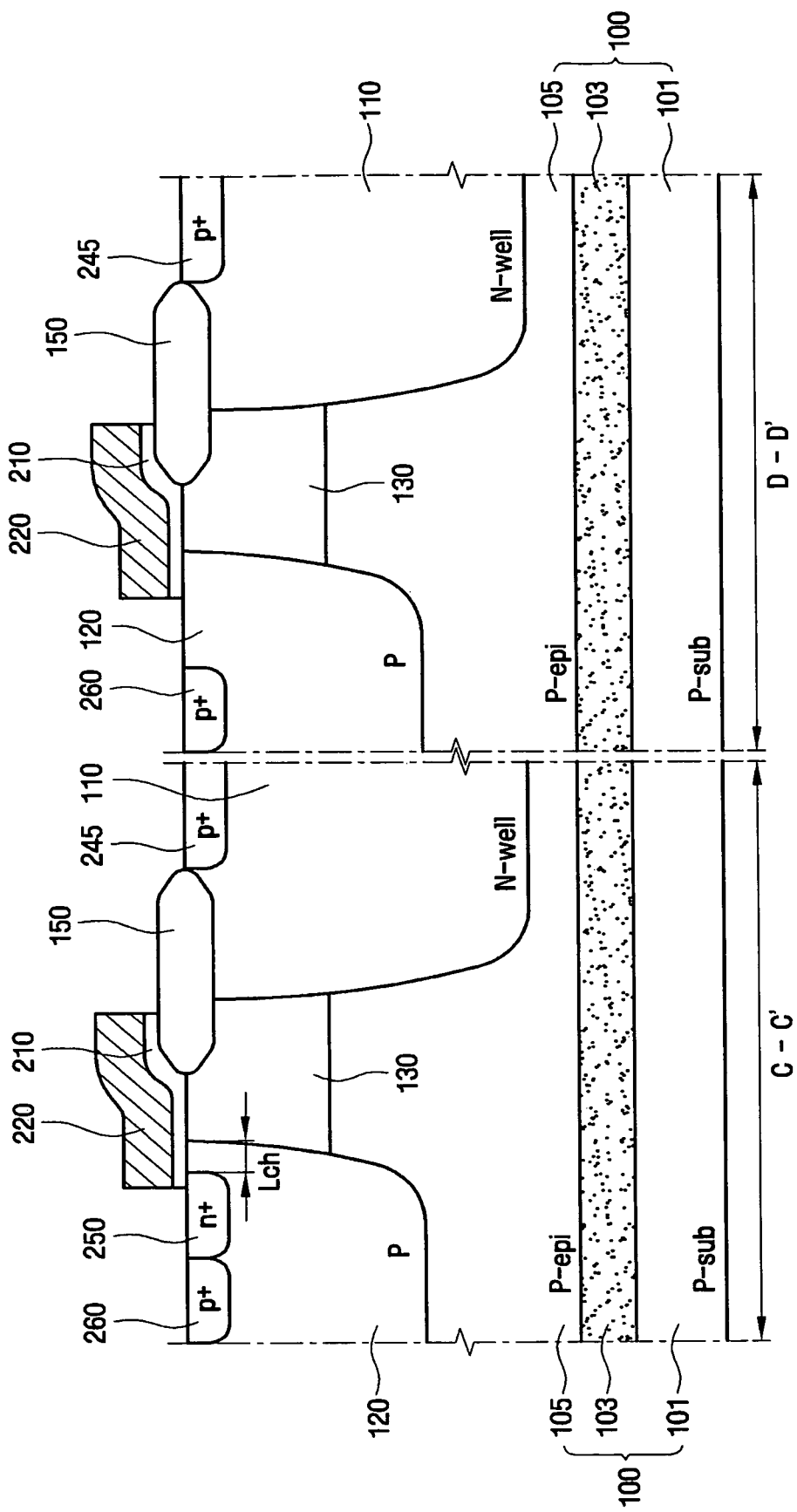

Referring to FIGS. 12-13, a semiconductor integrated circuit device may be substantially the same as the semiconductor integrated circuit device described with reference to FIGS. 1-2, with the exception of including an IGBT transistor. The IGBT transistor may be substantially the same as the LDMOS transistor, with the exception of including a plurality of P-type third dopant regions 245 in the active region 140. Other N-type and P-type dopant region structures and configurations with respect to a gate wire described previously with reference to FIGS. 1-11 may be included in the IGBT transistor of FIGS. 12-13.

A semiconductor integrated circuit device according to example embodiments may facilitate control of a length of a channel of a transistor. In particular, characteristics of the semiconductor integrated circuit device may be improved by forming source regions, i.e. dopant regions, with a substantially same orientation only at predetermined sides of a gate wire, so a length of a channel along the source regions may be substantially uniform. Further, a length of a channel may be controlled by adjusting configuration of the gate wire in addition to the source regions, so characteristics of the semiconductor integrated circuit device may be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor integrated circuit device, comprising:
 a first dopant region in a semiconductor substrate, the first dopant region extending in a first direction;
 an isolation region on the semiconductor substrate, the isolation region surrounding the first dopant region;
 a plurality of first gate portions, the plurality of first gate portions extending in the first direction and spaced apart from each other in a second direction perpendicular to the first direction; and
 a plurality of second dopant regions arranged along at least the parallel portion of the plurality of first gate portions, the plurality of second dopant regions being spaced apart from each other, and the plurality of first gate portions being between the first dopant region and a respective second dopant region, each of the plurality of second dopant regions being longer in the first direction than the first dopant region, wherein:
 the first gate portions include a plurality of linear regions, the second dopant regions being arranged along two or more of the linear regions, and
 the first gate portions have a substantially rectangular shape, the second dopant regions being arranged along two or more sides of the substantially rectangular shape.

2. The semiconductor integrated circuit device as claimed in claim 1, wherein the first gate portions include at least two linear regions facing each other, the second dopant regions being arranged in at least one of the linear regions.

3. The semiconductor integrated circuit device as claimed in claim 2, wherein the first gate portions include two linear regions facing each other and extending along a lengthwise direction of the first gate portions, the second dopant regions being arranged only in portions of the two linear regions extending along the lengthwise direction of the first gate portions.

4. The semiconductor integrated circuit device as claimed in claim 1, wherein the first dopant region is a drain region, and the second dopant region is a source region.

5. The semiconductor integrated circuit device as claimed in claim 4, wherein the first and second dopant regions have a substantially same conductivity type.

6. The semiconductor integrated circuit device as claimed in claim 4, wherein the first and second dopant regions have different conductivity types.

7. A semiconductor integrated circuit device, comprising:
a drain region in a semiconductor substrate, the drain region extending in a first direction;
an isolation region on the semiconductor substrate, the isolation region surrounding the drain region;
a plurality of first gate portions extending in the first direction and spaced apart from each other in a second direction perpendicular to the first direction, the plurality of first gate portions being external to the isolation region and including at least one pair of linear regions facing each other, the linear regions being parallel to the drain region;
a plurality of second gate portions extending in the second direction and spaced apart from each other in the first direction, the drain region being between two of the second gate portions; and
at least one pair of source regions arranged along the pair of linear regions of the plurality of first gate portions, the pair of source regions being arranged to face each other, each of the pair of source regions being longer in the first direction than the drain region.

8. The semiconductor integrated circuit device as claimed in claim 7, wherein the first gate portions are parallel to each other along a first direction.

9. The semiconductor integrated device as claimed in claim 7, wherein the plurality of first gate portions and the plurality of second gate portions are not in contact with each other.

10. A method of manufacturing a semiconductor integrated circuit device, the method comprising:
forming an isolation region on a substrate, such that the isolation region surrounds a portion of the semiconductor substrate to define a first active region in the semiconductor substrate;
forming a plurality of first gate portions, the plurality of first gate portions extending in the first direction and spaced apart from each other in a second direction perpendicular to the first direction;
forming a first dopant region in the first active region, the first dopant region extending in the first direction parallel to the parallel portion; and
forming a plurality of second dopant regions spaced apart from each other, the second dopant being arranged along at least the parallel portion of the plurality of first gate portions, such that the parallel portion of the plurality of first gate portions is between the first dopant region and a respective second dopant region, each of the plurality of second dopant regions being longer in the first direction than the first dopant region, the method further comprising:
forming a plurality of second gate portions, wherein the plurality of second gate portions extend in the second direction and are spaced apart from each other in the first direction, wherein the plurality of first gate portions and the plurality of second gate portions are not in contact with each other.

11. The method as claimed in claim 10, wherein the first gate portions are formed to include a plurality of linear regions, the second dopant regions being formed along two or more of the linear regions.

12. The method as claimed in claim 10, wherein the first gate portions include at least two linear regions facing each other, the second dopant regions being arranged in at least one of the linear regions.

13. The method as claimed in claim 10, wherein the first dopant region is formed to be a drain region, and the second dopant region is formed to be a source region.

14. The method as claimed in claim 10, wherein the first gate portions are formed only along a portion of the isolation region in parallel to each other, the drain region being formed between the first gate portions.

15. The method as claimed in claim 10, further comprising, before forming the isolation region:
forming a first conductive type well in the semiconductor substrate, such that the first conductive type well is under the first active region; and
forming a second conductive type dopant region around the first conductive type well, the second conductive type dopant region being horizontally spaced apart from the first conductive type well.

16. A semiconductor integrated device, comprising:
a first dopant region in a semiconductor substrate, the first dopant region extending in a first direction;
an isolation region on the semiconductor substrate, the isolation region surrounding the first dopant region;
a plurality of first gate portions, the plurality of first gate portions extending in the first direction and spaced apart from each other in a second direction perpendicular to the first direction;
a plurality of second gate portions, the plurality of second gate portions extending in the second direction and spaced apart from each other in the first direction; and
a plurality of second dopant regions arranged along at least the parallel portion of the plurality of first gate portions, the plurality of second dopant regions being spaced apart from each other, and the plurality of first gate portions being between the first dopant region and a respective second dopant region, each of the plurality of second dopant regions being longer in the first direction than the first dopant region, wherein the plurality of first gate portions and the plurality of second gate portions are not in contact with each other.

* * * * *